US012803504B2

(12) United States Patent
Han

(10) Patent No.: US 12,803,504 B2
(45) Date of Patent: Nov. 17, 2026

(54) AMPLIFIER CIRCUIT FOR MICROPHONE, MICROPHONE CIRCUIT AND ELECTRONIC DEVICE

(71) Applicant: AAC Technologies Pte. Ltd., Singapore (SG)

(72) Inventor: Dong Han, Singapore (SG)

(73) Assignee: AAC Technologies Pte. Ltd., Singapore (SG)

( * ) Notice: Subject to any disclaimer, the term of this patent is extended or adjusted under 35 U.S.C. 154(b) by 326 days.

(21) Appl. No.: 18/406,260

(22) Filed: Jan. 8, 2024

(65) Prior Publication Data

US 2025/0226800 A1 Jul. 10, 2025

(51) Int. Cl.
*H03F 1/30* (2006.01)
*H03F 1/32* (2006.01)
*H04R 3/00* (2006.01)

(52) U.S. Cl.
CPC ........... *H03F 1/3205* (2013.01); *H04R 3/002* (2013.01); *H03F 2200/03* (2013.01); *H03F 2200/151* (2013.01); *H04R 2410/03* (2013.01)

(58) Field of Classification Search
CPC ............... H03F 1/3205; H03F 2200/03; H03F 2200/151; H04R 3/00; H04R 3/002; H04R 19/04; H04R 19/016; H04R 19/005; H04R 2410/03
USPC ........ 381/120, 111, 175, 323, 28, 123, 94.5; 330/277, 300, 253, 297
See application file for complete search history.

(56) References Cited

U.S. PATENT DOCUMENTS

| | | | | |
|---|---|---|---|---|
| 2002/0032893 A1* | 3/2002 | Brooks | H03F 3/505 | 326/68 |
| 2010/0246858 A1* | 9/2010 | Enjalbert | H03F 3/45183 | 330/253 |

FOREIGN PATENT DOCUMENTS

| | | | | |
|---|---|---|---|---|
| CN | 114697844 A * | 7/2022 | H04R 19/005 | |

* cited by examiner

*Primary Examiner* — Norman Yu
(74) *Attorney, Agent, or Firm* — Wiersch Law Group

(57) ABSTRACT

An amplifier circuit for a microphone, a microphone circuit and an electronic device are provided. The amplifier circuit includes a first transistor having a gate serving as an input terminal of the amplifier circuit, a source serving as an output terminal of the amplifier circuit and a drain connected to ground, a first constant current source having an input terminal connected to a power supply and an output terminal connected to the source of the first transistor, and a source follower including at least a second transistor, having a drain connected to the power supply, a gate connected to the source of the first transistor and a source connected to the drain of the first transistor.

15 Claims, 3 Drawing Sheets

AMPLIFIER CIRCUIT FOR MICROPHONE, MICROPHONE CIRCUIT AND ELECTRONIC DEVICE

TECHNICAL FIELD

The various embodiments described in this document relate in general to the technical field of microphones, and more specifically to an amplifier circuit for a microphone, a microphone circuit and an electronic device.

BACKGROUND

With the development of mobile communication technology, cell phones, smart speakers, laptop computers, etc. have become common electronic products in life. A microphone circuit mounted in these electronic products usually include a microphone as well as an amplifier circuit for the microphone. The microphone, as a sound pickup unit, is used to convert sound signals into electrical signals, and the amplifier circuit is used to drive the signals output from the microphone and output them to a subsequent component.

Total harmonic distortion (THD for short) is an important indicator for evaluating the performance of a microphone. THD refers to a ratio of a root-mean-square (RMS for short) value of an output signal generated by the harmonic distortion and an RMS value of total output signal. The THD performance of current microphone amplifier circuits needs to be improved.

SUMMARY

In some embodiments, an amplifier circuit for a microphone, a microphone circuit and an electronic device are provided, so as to at least facilitate the improvement of THD performance of the amplifier circuit for the microphone.

In some embodiments, an amplifier circuit for a microphone is provided. The amplifier circuit includes a first transistor, a first constant current source and a source follower. The first transistor has a gate serving as an input terminal of the amplifier circuit, a source serving as an output terminal of the amplifier circuit and a drain connected to ground. The first constant current source has an input terminal connected to a power supply and an output terminal connected to the source of the first transistor. The source follower includes at least a second transistor, having a drain connected to the power supply, a gate connected to the source of the first transistor, and a source connected to the drain of the first transistor.

In some embodiments, the source follower further includes a second constant current source, having an input terminal connected to the power supply, and an output terminal connected to the drain of the second transistor.

In some embodiments, the amplifier circuit further includes a third transistor, having a gate connected to the drain of the second transistor, a source connected to the power supply, and a drain connected to the source of the first transistor.

In some embodiments, the third transistor is a P-channel metal oxide semiconductor (PMOS for short) transistor.

In some embodiments, the amplifier circuit further includes a bias branch circuit, configured to provide a bias current sink to the first transistor and the second transistor.

In some embodiments, the bias branch circuit further includes a bias transistor, a resistor, a third constant current source and a fourth transistor. The bias transistor has a drain connected to the drain of the first transistor, a gate and a source. The resistor has a first end connected to the source of the bias transistor, and a second end connected to the ground. The third constant current source has an input terminal connected to the power supply and an output terminal connected to the gate of the bias transistor. The fourth transistor has a gate connected to the source of the bias transistor, a drain connected to the gate of the bias transistor M0 and a source connected to the ground.

In some embodiments, the bias transistor and the fourth transistor are N-channel metal oxide semiconductor (NMOS) transistors.

In some embodiments, the bias branch circuit includes a fourth constant current source, having one terminal connected to the drain of the first transistor, and another terminal connected to the ground.

In some embodiments, the first transistor is a PMOS transistor, the second transistor is an NMOS transistor.

In some embodiments, a microphone circuit is provided. The microphone circuit includes an amplifier circuit as described above and a microphone. The microphone has a first end connected to a microphone bias power supply and a second end connected to the input terminal of the amplifier circuit.

In some embodiments, an electronic device is provided. The electronic device includes an amplifier circuit for a microphone as described above, or a microphone circuit as described above.

According to the embodiments of the present disclosure, an amplifier circuit for a microphone is provided to make a voltage across the gate-to-drain parasitic capacitor Cgd of the first transistor in the amplifier circuit constant or ensures that the amount of variation of the voltage across the gate-to-drain parasitic capacitor Cgd of the first transistor is very small by means of a circuit improvement, and thus ensuring that there is no change or very little change of the charge across the parasitic capacitor Cgd, thereby effectively attenuating or even cancelling the capacitive loading effect of the parasitic capacitor Cgd, and improving the THD performance of the amplifier circuit.

BRIEF DESCRIPTION OF THE DRAWINGS

The embodiments of the present disclosure are illustrated by way of example and not limitation in the figures of the accompanying drawings, in which like references may indicate similar elements.

DETAILED DESCRIPTION OF THE EMBODIMENTS

As can be seen from the background, the THD performance of current microphone amplifier circuits needs to be improved.

Figure 1:
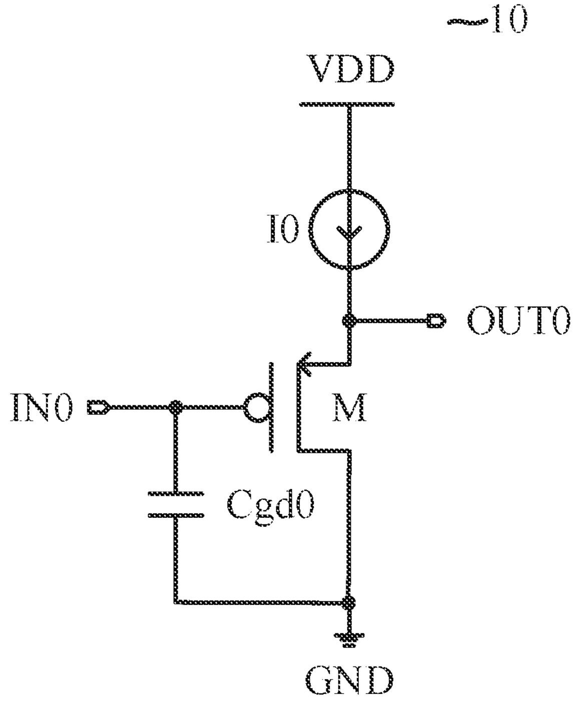
FIG. 1 is a schematic diagram of a structure of an amplifier circuit for a microphone in accordance with the related art.

FIG. 1 is a schematic diagram of a structure of an amplifier circuit for a microphone in accordance with the related art. Referring to FIG. 1, the amplifier circuit 10 has an input terminal IN0 configured to receive a signal from an external microphone, and an output terminal OUT0 configured to output a signal that is obtained by the amplifier circuit 10 amplifying the input signal. Specifically, the amplifier circuit 10 includes a transistor M and a constant current source I0. The transistor M has a gate serving as the input terminal IN0 of the amplifier circuit 10, a source serving as the output terminal OUT0 of the amplifier circuit 10 and a drain connected to ground GND. The constant current source I0 has an input terminal connected to a power supply VDD, and an output terminal connected to the source of the transistor M0.

Here, the external microphone may be a Micro-electromechanical system (MEMS) sensor. A standalone MEMS sensor may have high 1% THD when the MEMS sensor has no capacitive load. In the amplifier circuit 10 as shown in FIG. 1, a parasitic capacitor Cgd0 presents between the gate and the drain of the transistor M increases an input capacitance of the amplifier circuit 10. For a standalone amplifier, if the input signal has high driving ability, Cgd0 also has minor effect to the amplifier's 1% THD. The problem is that: The MEMS sensor has very high impedance at MEMS output, the driving ability of the MEMS sensor is very weak, and when the MEMS sensor is connected with the amplifier, the parasitic capacitor Cgd0 presented as a capacitive load to the MEMS sensor. In this case, the parasitic capacitor Cgd0 significantly degrades 1% THD of the overall MEMS and amplifier system. The loading effect of the parasitic capacitor Cgd0 results in poor THD performance of the amplifier circuit 10, which in turn results in distortion of sound output from the smart mobile device to which the amplifier circuit is applied.

In order to solve the above problem, in accordance with some embodiments of the present disclosure, an amplifier circuit for a microphone is provided to ensure that a voltage across the parasitic capacitor Cgd is constant, or to ensure that the amount of variation of the voltage across the parasitic capacitor Cgd is very small, and thus to ensure that there is no or very little change of charge across the parasitic capacitor Cgd, to reduce the capacitive loading of the MEMS sensor, thereby effectively diminishing, or even cancelling, the capacitive loading effect of the parasitic capacitor Cgd to the MEMS sensor and improving the THD performance of the system including the MEMS sensor and the amplifier circuit.

Various embodiments of the present disclosure will be described in detail below in combination with the accompanying drawings. However, a person of ordinary skill in the art should understand that, in the various embodiments of the present disclosure, a number of technical details have been proposed in order to enable the reader to better understand the embodiments of the present disclosure. However, even without these technical details and various changes and modifications based on the following embodiments, the technical solutions claimed to be protected by the embodiments of the present disclosure can be realized.

Figure 2:
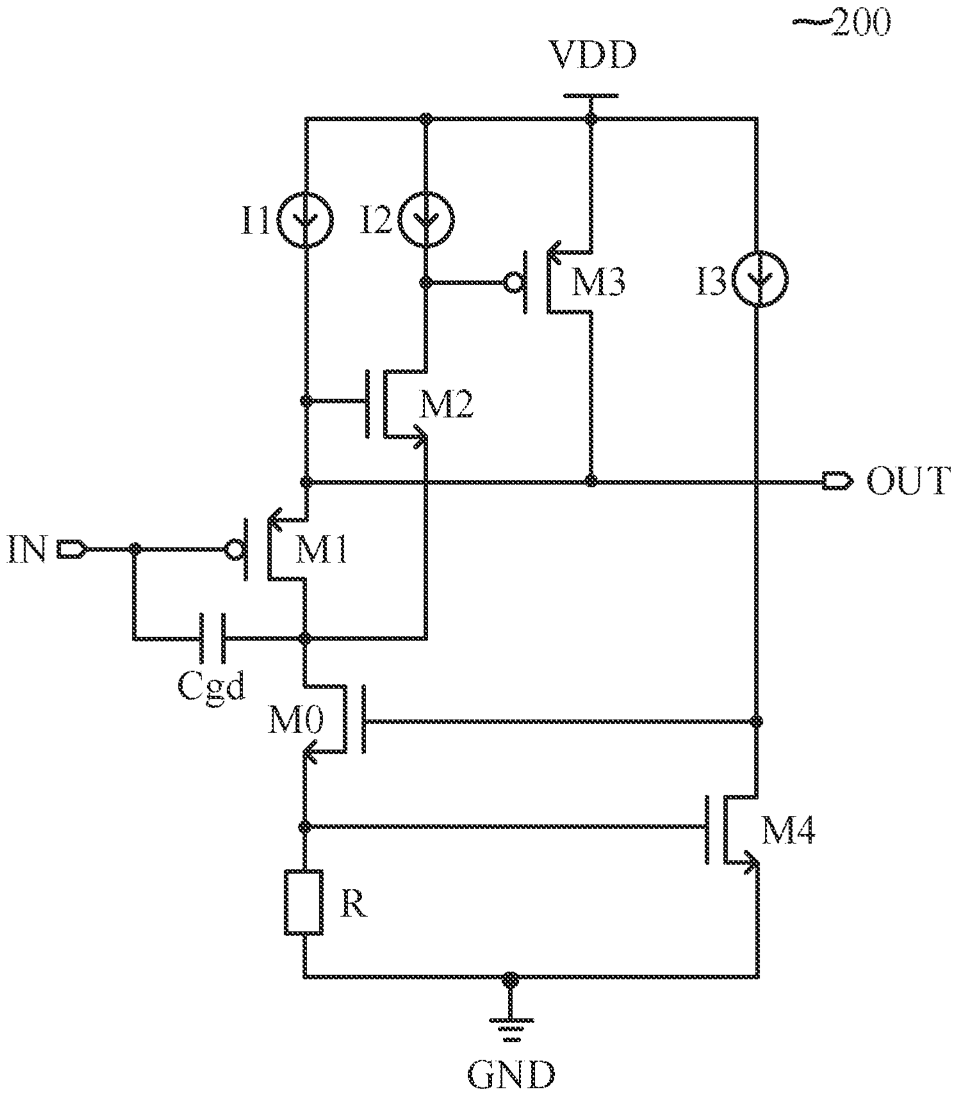
FIG. 2 is a schematic diagram illustrating a structure of an amplifier circuit for a microphone in accordance with some embodiments.

FIG. 2 is a schematic diagram illustrating a structure of an amplifier circuit for a microphone in accordance with some embodiments of the present disclosure.

Referring to FIG. 2, the amplifier circuit 200 has an input terminal IN configured to receive an acoustic pressure signal from an external microphone, and an output terminal OUT configured to output a signal obtained by the amplifier circuit 200 amplifying the acoustic pressure signal.

The amplifier circuit 200 includes a first transistor M1 and a first constant current source I1. The first transistor M1 has a gate serving as the input terminal IN of the amplifier circuit 200, a source serving as the output terminal OUT of the amplifier circuit 200 and a drain connected to ground GND. The first constant current source I1 has an input terminal connected to a power supply VDD, and an output terminal connected to the source of the first transistor M1.

The amplifier circuit 200 includes a source follower. The source follower includes at least a second transistor M2. The second transistor M2 has a gate connected to the source of the first transistor M1, a source connected to the drain of the first transistor M1, and a drain connected to the power supply VDD. The second transistor M2 is a source follower, which makes the voltage Vgd between the gate and the drain of the first transistor M1 constant. That is, there is no charge change across the parasitic capacitor Cgd. Therefore, the capacitive loading effect of Cgd to prior MEMS sensor is cancelled, and the application specific integrated circuit (ASIC for short) input capacitance is ultra-low. Consequently, the system including the MEMS sensor and the amplifier 1% THD Performance is improved.

In some embodiments, the source follower further includes a second constant current source I2. In this case, the drain of the second transistor M2 connected to the power supply VDD through the second constant current source I2. The second constant current source I2 has an input terminal connected to the power supply VDD, and an output terminal connected to the drain of the second transistor M2. The second constant current source I2 and the second transistor M2 constitute a source follower to cancel the parasitic capacitor Cgd's loading effect to prior MEMS sensor.

The second constant current source I2 is used to provide a constant current to the second transistor M2 so that the voltage VGS2 between the gate and the source of the second transistor M2 is constant, which in turn leads to the voltage VSD1 between the source and the drain of the first transistor M1 to be constant, so as to make the voltage VGD1 between the gate and the drain of the first transistor M1 constant, i.e., the voltage across the parasitic capacitor Cgd is constant. Alternatively, the second constant current source I2 is used to provide a constant current to the second transistor M2, so that there is small variation of the voltage VGS2 between the gate and the source of the second transistor M2, and thus the amount of variation of the voltage VSD1 between the source and the drain of the first transistor M1 is small, so as to make the voltage VGD1 between the gate and the drain of the first transistor M1 change by a relatively small amount, i.e., the voltage across the parasitic capacitor Cgd changes by a relatively small amount.

In this way, by setting the second transistor M2 to make the voltage across the parasitic capacitor Cgd constant, or to make the amount of change in the voltage across the parasitic capacitor Cgd change by a relatively small amount, thereby ensuring that there is no change or a very small amount of change in the charge across the parasitic capacitor Cgd, and effectively attenuating, or even cancelling, the capacitive loading effect caused by the parasitic capacitor Cgd to the prior MEMS sensor, the THD performance of the system including the MEMS sensor and the amplifier circuit 200 is improved.

In some embodiments, the first transistor M1 is a PMOS transistor, and the second transistor M2 is an NMOS transistor.

In some embodiments, the amplifier circuit 200 further includes a third transistor M3. The third transistor M3 has a gate connected to the drain of the second transistor M2, a source connected to the power supply VDD, and a drain connected to the source of the first transistor M1. The voltage VSG3 between the source and the gate of the third transistor M3 is used to define the voltage between the two terminals of the second constant current source I2, and M3 also provides an output current from the power supply VDD through the third transistor M3 and the output terminal to the loading circuit of the amplifier circuit 200. The first transistor M1 provides current sink from the loading circuit of the amplifier circuit 200 through the output terminal to the source of the first transistor M1. The first transistor M1 and the third transistor M3 constitute a push/pull driving circuit.

In some embodiments, the third transistor M3 is a PMOS transistor.

In some embodiments, the amplifier circuit 200 further includes a bias branch circuit, configured to provide a bias current sink to the first transistor M1 and the second transistor M2.

In some embodiments, the bias branch circuit includes a bias transistor M0, a resistor R, a third constant current source I3 and a fourth transistor M4. The bias transistor M0 has a drain connected to the drain of the first transistor M1, a gate and a source. The resistor R has a first end connected to the source of the bias transistor M0, and a second end connected to the ground GND. The third constant current source I3 has an input terminal connected to the power supply VDD, and an output terminal connected to the gate of the bias transistor M0. The fourth transistor M4 has a gate connected to the source of the bias transistor M0, a drain connected to the gate of the bias transistor M0 and a source connected to the ground GND. In this case, the bias transistor M0, the resistor R, the third constant current source I3 and the fourth transistor M4 together provide a bias current sink to the first transistor M1 and the second transistor M2. Since the current sink biasing circuit including the third constant current source I3, the fourth transistor M4, the resistor R and the bias transistor M0 provides a constant current sink to the drain of the first transistor M1 and the source of the second transistor M2, the channel current of the first transistor M1 is constant, thus the voltage VGS1 between the gate and the source of the first transistor M1 is constant, so as to make the voltage VGD1 between the gate and the drain of the first transistor M1 constant, i.e., the voltage across the parasitic capacitor Cgd is constant.

In some embodiments, the bias transistor M0 and the fourth transistor M4 are NMOS transistors.

In some other embodiments, a constant current source may be used to provide a bias current sink to the first transistor M1 and the second transistor M2. Specifically, as shown in FIG. 3, the bias branch circuit includes another constant current source I4, having one terminal connected to the drain of the first transistor M1 and another terminal connected to the ground GND.

The amplifier circuit in accordance with the above embodiments of the present disclosure makes the voltage across the gate-to-drain parasitic capacitor Cgd of the first transistor in the amplifier circuit constant or ensures that the amount of variation of the voltage across the gate-to-drain parasitic capacitor Cgd of the first transistor is very small by means of a circuit improvement, and thus ensures that there is no or very little change of the charge across the parasitic capacitor Cgd, thereby effectively attenuating or even cancelling the loading effect of the parasitic capacitor Cgd to the MEMS sensor, and improving the THD performance of the system including the MEMS sensor and the amplifier circuit.

Figure 4:
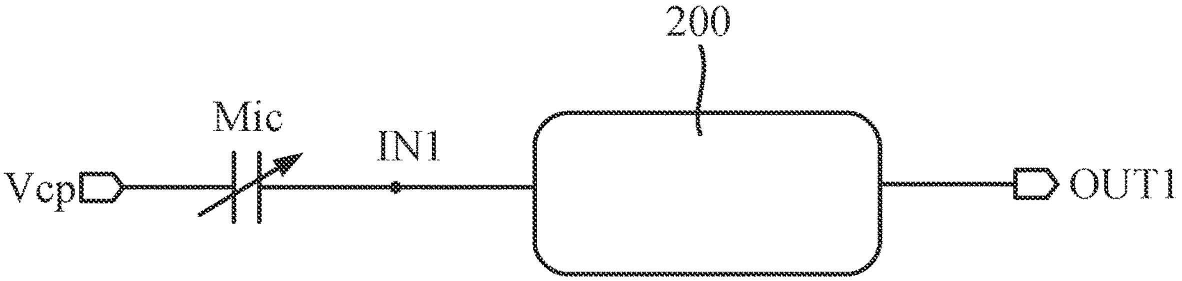
FIG. 4 is a schematic diagram illustrating a structure of a microphone circuit in accordance with some embodiments.

FIG. 4 is a schematic diagram illustrating a structure of a microphone circuit in accordance with some embodiments.

Figure 3:
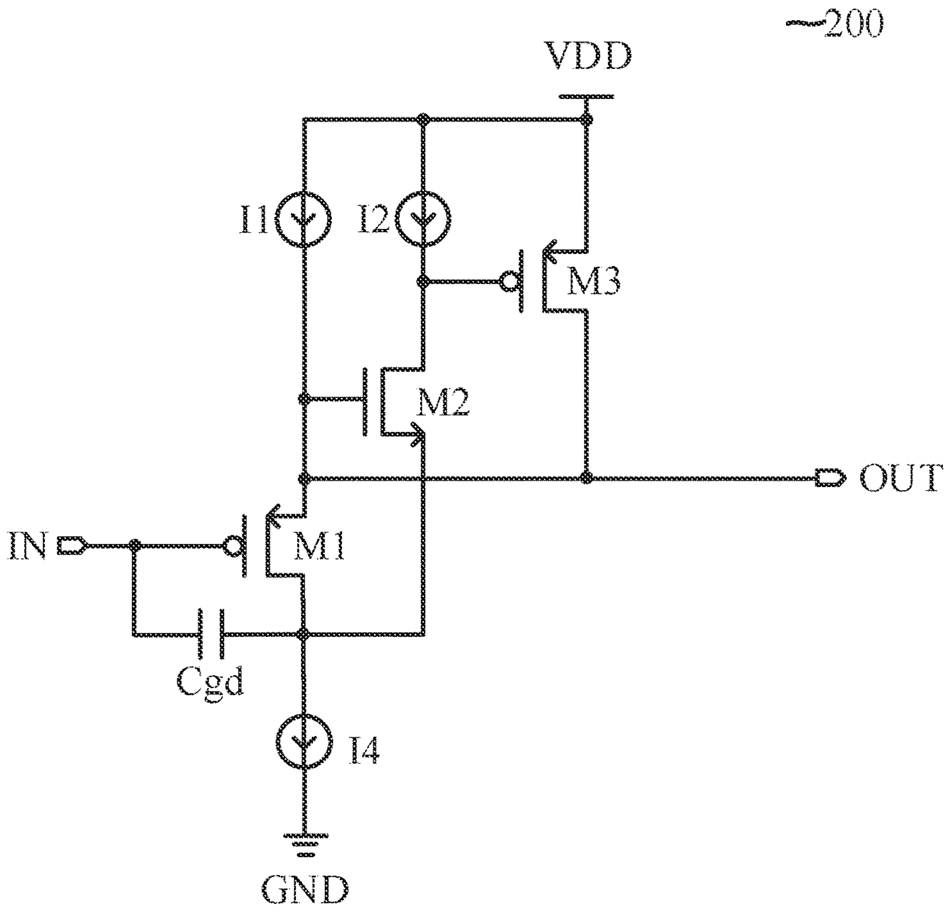
FIG. 3 is a schematic diagram illustrating another structure of an amplifier circuit for a microphone in accordance with some embodiments.

Referring to FIG. 3, the microphone circuit includes a microphone Mic and the amplifier circuit 200 as described in any of the above embodiments. The microphone Mic has a first end connected to a microphone bias voltage Vcp, and a second end connected to an input terminal IN1 of the amplifier circuit 200.

According to the embodiments of the present invention, an electronic device is provided. The electronic device includes an amplifier circuit for a microphone as described in any one of the above embodiments, or includes a microphone circuit as described in any one of the above embodiments.

It will be understood that, although the terms first, second, etc., are, in some instances, used herein to describe various elements, these elements should not be limited by these terms. These terms are only used to distinguish one element from another. For example, a first transistor could be termed a second transistor, and, similarly, a second transistor could be termed a first transistor, without departing from the scope of the various described embodiments. The first constant current source and the second constant current source are both constant current source, but they are not the same condition unless explicitly stated as such.

When a certain part "includes" another part throughout the specification, other parts are not excluded unless otherwise stated, and other parts may be further included. In addition, when parts such as a transistor, is referred to as being "connected to" another part, it may be "directly connected to" another part or may have another part present therebetween. In addition, when a part of a layer, film, region, plate, etc., is "directly connected to" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated. The scope of protection of the present disclosure shall be as limited by the appended claims.

What is claimed is:

1. An amplifier circuit for a microphone, comprising:

a first transistor, having a gate serving as an input terminal of the amplifier circuit, a source serving as an output terminal of the amplifier circuit, and a drain connected to ground;

a first constant current source, having an input terminal connected to a power supply and an output terminal connected to the source of the first transistor;

a source follower, including at least a second transistor, having a drain connected to the power supply, a gate connected to the source of the first transistor, and a source connected to the drain of the first transistor; and a bias branch circuit, configured to provide a bias current sink to the first transistor and the second transistor, the bias branch circuit includes:

a bias transistor, having a drain connected to the drain of the first transistor, a gate and a source;

a resistor, having a first end connected to the source of the bias transistor, and a second end connected to the ground;

a third constant current source, having an input terminal connected to the power supply and an output terminal connected to the gate of the bias transistor; and a fourth transistor, having a gate connected to the source of the bias transistor, a drain connected to the gate of the bias transistor M0 and a source connected to the ground.

2. The amplifier circuit according to claim 1, wherein the source follower further includes:

a second constant current source, having an input terminal connected to the power supply, and an output terminal connected to the drain of the second transistor.

3. The amplifier circuit according to claim 2, wherein the amplifier circuit further includes:

a third transistor, having a gate connected to the drain of the second transistor, a source connected to the power supply, and a drain connected to the source of the first transistor.

4. The amplifier circuit according to claim 3, wherein the third transistor is a P-channel metal oxide semiconductor (PMOS) transistor.

5. The amplifier circuit according to claim 1, wherein the bias transistor and the fourth transistor are N-channel metal oxide semiconductor (NMOS) transistors.

6. The amplifier circuit according to claim 1, wherein the bias branch circuit includes a fourth constant current source, having one terminal connected to the drain of the first transistor, and another terminal connected to the ground.

7. The amplifier circuit according to claim 1, wherein the first transistor is a PMOS transistor, the second transistor is an NMOS transistor.

8. A microphone circuit, comprising:

an amplifier circuit including:

a first transistor, having a gate serving as an input terminal of the amplifier circuit, a source serving as an output terminal of the amplifier circuit, and a drain connected to ground;

a first constant current source, having an input terminal connected to a power supply and an output terminal connected to the source of the first transistor; and a source follower, including at least a second transistor, having a drain connected to the power supply, a gate connected to the source of the first transistor, and a source connected to the drain of the first transistor; and a bias branch circuit, configured to provide a bias current sink to the first transistor and the second transistor, the bias branch circuit further includes:

a bias transistor, having a drain connected to the drain of the first transistor, a gate and a source;

a resistor, having a first end connected to the source of the bias transistor, and a second end connected to the ground;

a third constant current source, having an input terminal connected to the power supply and an output terminal connected to the gate of the bias transistor; and a fourth transistor, having a gate connected to the source of the bias transistor, a drain connected to the gate of the bias transistor M0 and a source connected to the ground; and a microphone, having a first end connected to a microphone bias power supply and a second end connected to the input terminal of the amplifier circuit.

9. The microphone circuit according to claim 8, wherein the source follower further includes:

a second constant current source, having an input terminal connected to the power supply, and an output terminal connected to the drain of the second transistor.

10. The microphone circuit according to claim 8, wherein the source follower further includes:

a third transistor, having a gate connected to the drain of the second transistor, a source connected to the power supply, and a drain connected to the source of the first transistor.

11. The microphone circuit according to claim 10, wherein the third transistor is a P-channel metal oxide semiconductor (PMOS) transistor.

12. The microphone circuit according to claim 8, wherein the bias transistor and the fourth transistor are N-channel metal oxide semiconductor (NMOS) transistors.

13. The microphone circuit according to claim 8, wherein the bias branch circuit includes a fourth constant current source, having one terminal connected to the drain of the first transistor, and another terminal connected to the ground.

14. The microphone circuit according to claim 8, wherein the first transistor is a PMOS transistor, the second transistor is an NMOS transistor.

15. An electronic device, comprising the amplifier circuit for the microphone according to claim 1.

* * * * *